(12) United States Patent
Levy et al.

(10) Patent No.: US 7,015,896 B2
(45) Date of Patent: Mar. 21, 2006

(54) KEYBOARDS WITH BOTH INDIVIDUAL AND COMBINATION KEY OUTPUT

(75) Inventors: David H. Levy, Cambridge, MA (US);
Paul D. Butler, Haverhill, MA (US);
Scott A. Rhodes, Wakefield, MA (US)

(73) Assignee: Digit Wireless, LLC, Cambridge, MA (US)

( * ) Notice: Subject to any disclaimer, the term of this patent is extended or adjusted under 35 U.S.C. 154(b) by 154 days.

(21) Appl. No.: 09/916,928

(22) Filed: Jul. 27, 2001

(65) Prior Publication Data

US 2002/0070923 A1   Jun. 13, 2002

Related U.S. Application Data

(63) Continuation-in-part of application No. 09/236,199, filed on Jan. 23, 1999, now abandoned.

(60) Provisional application No. 60/072,302, filed on Jan. 23, 1998, provisional application No. 60/079,187, filed on Mar. 24, 1998.

(51) Int. Cl.
*G09G 5/00*   (2006.01)

(52) U.S. Cl. ...................................... 345/168; 345/172
(58) Field of Classification Search ........ 345/168–172; 341/22–34; 708/142, 145, 146
See application file for complete search history.

(56) References Cited

U.S. PATENT DOCUMENTS

| | | | |
|---|---|---|---|
| 4,400,593 A | 8/1983 | Kunz | |
| 4,549,279 A | 10/1985 | Lapeyre | |
| 4,891,777 A | 1/1990 | Lapeyre | |
| 4,912,462 A | 3/1990 | Washizuka et al. | |
| 4,994,992 A | 2/1991 | Lapeyre | |
| 5,124,689 A | 6/1992 | Franz et al. | |
| 5,339,358 A * | 8/1994 | Danish et al. | 379/368 |
| 5,457,454 A | 10/1995 | Sugano | |
| 5,465,290 A | 11/1995 | Hampton et al. | |
| 5,486,823 A | 1/1996 | Tsai | |
| 5,491,745 A | 2/1996 | Roeder | |
| 5,612,690 A | 3/1997 | Levy | |
| 5,914,677 A * | 6/1999 | Ahmadian | 341/26 |
| 5,943,043 A * | 8/1999 | Furuhata et al. | 345/173 |
| 5,973,621 A | 10/1999 | Levy | |
| 5,982,357 A | 11/1999 | Burgett et al. | |
| 6,037,882 A | 3/2000 | Levy | |
| 6,204,839 B1 | 3/2001 | Mato, Jr. | |
| 6,559,778 B1 * | 5/2003 | Hillmering | 341/23 |

FOREIGN PATENT DOCUMENTS

| | | |
|---|---|---|
| DE | 2235898 | 7/1972 |
| DE | 25 36 736 | 3/1977 |
| DE | 3446147 A1 | 6/1986 |
| WO | WO 00/44014 | 7/2000 |
| WO | WO 01/95358 | 12/2001 |

* cited by examiner

*Primary Examiner*—Dennis-Doon Chow
(74) *Attorney, Agent, or Firm*—Fish & Richardson P.C.

(57) ABSTRACT

Methods of providing input feedback in a device having a keyboard with a matrix of independent keys having associated switches arranged in rows and columns, wherein combinations of diagonally adjacent keys are associated with combination key outputs, and devices performing such methods. One method includes scanning for activated keys, providing provisional output to a user indicating that the activated key has been registered; continuing to scan the matrix; and, in response to activation of an adjacent key prior to release of the first activated key, providing final output to the user indicating that a combination of the first and adjacent keys has been registered, to the exclusion of the provisional output. Another features driving the rows in adjacent pairs while examining the columns for switch activation; and, in response to detecting switch activation in two adjacent columns while driving the rows in adjacent pairs, determining a combination key output.

17 Claims, 8 Drawing Sheets

| | Col1 | Col2 | Col3 | Col4 |
|---|---|---|---|---|
| Row1 | 1 | 8 | 15 | 22 |
| Row2 | 2 | 9 | 16 | 23 |
| Row3 | 3 | 10 | 17 | 24 |
| Row4 | 4 | 11 | 18 | 25 |
| Row5 | 5 | 12 | 19 | 26 |
| Row6 | 6 | 13 | 20 | 27 |
| Row7 | 7 | 14 | 21 | 28 |

| | Col1 | Col2 | Col3 | Col4 | Col5 |
|---|---|---|---|---|---|
| Ghost1 | (0) | (13) | (26) | (39) | (52) |
| Row1 | 1 | 14 | 27 | 40 | 53 |
| Row2 | 2 | 15 | 28 | 41 | 54 |
| Row3 | 3 | 16 | 29 | 42 | 55 |
| Row4 | 4 | 17 | 30 | 43 | 56 |
| Row5 | 5 | 18 | 31 | 44 | 57 |
| Row6 | 6 | 19 | 32 | 45 | 58 |
| Row7 | 7 | 20 | 33 | 46 | 59 |
| Ghost2 | (8) | (21) | (34) | (47) | (60) |
| Mixed1 | 9 | 22 | (35) | (48) | (61) |
| Mixed2 | 10 | 23 | (36) | (49) | (62) |
| Mixed3 | (11) | (24) | (37) | (50) | (63) |
| Ghost3 | (12) | (25) | (38) | (51) | (64) |

KEYBOARDS WITH BOTH INDIVIDUAL AND COMBINATION KEY OUTPUT

This application is a continuation-in-part of U.S. Ser. No. 09/236,199, filed Jan. 23, 1999 now abandoned and based on provisional application 60/072,302 filed Jan. 23, 1998 and provisional application 60/079,187 filed Mar. 24, 1998. The content of all of these applications are incorporated by reference herein as if set forth in their entirety.

TECHNICAL FIELD

This invention relates to tiled keyboards with keys that provide unique outputs as a consequence of both individual keys and with the actuation of adjacent keys associated with an interstice, and to the interpretation of data entered on such keyboards.

BACKGROUND

Miniaturization is a central paradigm in the advance of technology. A second paradigm of technologic advance is the continual increase in the complexity of products, which is, in turn, associated with the need for an increase in the number of buttons. These two fundamental paradigms are in opposition, suggesting that as time progresses, the need for smaller (yet useful) input devices will increase as overall product size decreases and the demand for additional functionality continues to rise. While voice technologies will certainly one day offer high-quality, low-cost, near-zero-size input, it is clear that such technology will always be inappropriate for use in such common instances as: a classroom, a meeting, while in mass transit (air or land), a library, etc. Therefore, to provide a continued path for these fundamental technologic advance curves, it is extremely desirable to manufacture low-cost keyboards with both maximal output density and maximal ease of use. Maximal output density means: the most single-touch operations in the smallest space. Maximal ease-of use means primarily two things: 1) Each output must be easily operated as quickly as a user may want without accidentally actuating an adjacent output and 2) in order to be intuitive and natural, the technique for actuating the output should be based on the universally known and accepted "button" paradigms, including use patterns and feel.

The density issue was well-addressed by U.S. Pat. No. 5,612,690 to Levy, but did not address ease-of-use issues. Pertinent prior art includes U.S. Pat. Nos. 4,549,279 and 4,994,992 to Lapeyre. In These patent provide a large number of one-touch accessible operations (4MN−2M−2n+1 in an area of M×N adult human finger widths) by pressing at the adjacent edge, centers, or intersections of full sized keys. U.S. Pat. No. 4,400,593 to Kunz provides the same density using miniaturized tiled keys, however with keys too small to allow edge key operation. U.S. Pat. No. 5,612,690 provides a significant advance to the above mentioned patents by introducing a "volcano" structure to the centers of reduced size keys and substantially increasing the maximal output density to 8MN−4m−4n+1. However, none of these patents discuss the significant and non-obvious barriers to successful implementation of either tiled keyboards, or of keyboards with both individual and combination key outputs.

For example, it is relatively trivial to implement a keyed device that operates only with individual keys, OR only with keys in combination. However, it is very difficult to implement a device that operates quickly and reliably both with individual keys and with keys in combination. To scan for only keys in combination is relatively trivial because reliable output may be determined whenever two opposing keys are registered using well-understood solutions to key switch debounce. However, when the device also outputs individual keys, there is an inherent tension between the desire to provide fast individual key operation and reliable combination key operation. Reason: in order to increase the reliability of combination keys, the time delay to wait for the appearance of all opposing keys in combination must be increased. This increase slows operation of the individual keys. The instant invention addresses this problem to provide fast individual key operation and reliable combination key operation. It is desirable for IACK keyboards to provide fast output response without degradation of the output accuracy.

Some recent advances in the field of IACK keypads are disclosed in my U.S. patent application Ser. No. 09/862,948, filed May 22, 2001, the entire contents of which are incorporated by reference herein as if set forth in their entirety.

SUMMARY

According ton one aspect of the invention, a method is provided for providing input feedback in a device having a keyboard with a matrix of independent keys having associated switches. The method comprises scanning the matrix for activated keys; upon detection of a first activated key, providing provisional output to a user indicating that the activated key has been registered; continuing to soan the matrix for activation of an adjacent key prior to release of the first activated key; and, in response to activation of an adjacent key prior to release of the first activated key, providing final output to the user indicating that a combination of the first and adjacent keys has been registered, to the exclusion of the provisional output.

By 'switch' we mean to include any contacting or non-contacting device, either passive or active, that provides an output indicative of the activation of its associated key, including, for example, a region of a force-sensitive or proximity-sensitive grid underlying more than one key, such as described in the U.S. patent application incorporated above by reference.

In some instances, either the final output or the provisional output, or both, is/are provided as visual feedback. The provisional output may also be provided as audio feedback.

Scanning the matrix includes, in some cases, scanning rows and columns.

In some embodiments, scanning the matrix includes driving two adjacent rows simultaneously, seeking for two simultaneous output columns.

Continuing to scan the matrix for activation of an adjacent key includes, in some configurations, determining if a diagonally adjacent key is activated.

In some embodiments, the method includes looking up a desired combination key in an internal table in response to activation of an adjacent key prior to release of the first activated key.

Providing provisional output may include, for example, storing the provisional output as raw data into a register.

In some embodiments, the provisional output is provided as feedback and providing the provisional output includes determining the provisional output upon detection of the first activated key, and then delaying a predetermined amount of time (e.g., about 20 milliseconds) after the provisional output is determined before providing feedback. In some cases, the amount of delay time is determined from measured time between key strokes and details of correction.

This method is particularly advantageous where the independent keys of the keyboard have exposed surfaces elevated above exposed surfaces of interstitial regions of the keyboard between adjacent independent keys that together form a key combination corresponding to a stored combination key output.

According to another aspect of the invention, a method of providing input feedback in a device having a keyboard with a matrix of independent keys having associated switches arranged in rows and columns, wherein combinations of diagonally adjacent keys are associated with combination key outputs, is provided. The method includes driving the rows in adjacent pairs while examining the columns for switch activation, and, in response to detecting switch activation in two adjacent columns while driving the rows in adjacent pairs, determining a combination key output.

Preferably the method includes, prior to driving the rows in adjacent pairs, driving the rows of key switches while searching on the columns for switch activity; and then driving the rows in adjacent pairs in response to detection of an activated switch on at least one of the columns. All rows of key switches may be driven simultaneously, for example, while searching on the columns for any switch activity. Furthermore, in some cases the method includes, after determining the combination key output, waiting until all columns are low before again driving all rows of switches.

In some embodiments the method includes, in response to detecting switch activation in only one column while driving the rows in adjacent pairs, determining an individual key output, such as by setting a first hit counter for keeping track of a number of cycles that an indicated key is activated, incrementing the first hit counter each cycle, and, when the first hit counter has reached a predetermined number (e.g., an equivalent of approximately 20 to 30 milliseconds, or even approximately 200 milliseconds), registering an independent key output associated with the indicated key. Preferably, after registering the independent key output, the first hit counter is reset and the algorithm waits until all columns are low before again driving the rows of switches. The predetermined number is incorporated into a learn mode, which may include increasing the predetermined number in response to delete key usage after registering an individual key, followed by an input of an associated combination key.

This method, as well as the ones discussed below, are also particularly advantageous where the independent keys of the keyboard have exposed surfaces elevated above exposed surfaces of interstitial regions of the keyboard between adjacent independent keys corresponding to combinations of diagonally adjacent keys associated with combination key outputs.

According to another aspect of the invention, a method of determining input in a device having a keyboard with a matrix of independent keys having associated switches in a known arrangement, wherein combinations of adjacent keys are associated with combination key inputs, includes identifying independent keys of legitimate combination key inputs in association with a first activated key, by adding each of a predetermined set of numbers to a sequence number associated with the activated key, to determine sequence numbers of legitimate combination-producing independent keys associated with the activated key, the predetermined set of numbers based upon the known switch arrangement; and then identifying legitimate combination-producing independent keys in a table associating keys and sequence numbers, from the determined sequence numbers.

In some cases the method further includes, after identifying independent keys of legitimate combination key inputs in association with a first activated key, and in response to activation of one of the identified legitimate combination-producing independent keys, registering an input associated with a combination of the first activated key and the activated one of the identified legitimate combination-producing independent keys.

In some embodiments, after identifying legitimate combination-producing independent keys, the method includes specifically checking for activation of the identified legitimate combination-producing independent keys.

This method is particularly useful where the key switches are arranged in rows and columns, and wherein legitimate key combinations having associated inputs are combinations of diagonally adjacent keys. In such instances, the predetermined set of numbers consists of values associated with (R+1) and (R−1), for example, where R is a number of rows of the key matrix.

In some cases checking for activation of legitimate combination-producing independent keys includes evaluating results of a scan from which the first activated key is identified.

In some embodiments in which the first activated key is identified on a first scan of the key matrix, specifically checking for activation of the identified legitimate combination-producing independent keys includes scanning the matrix a subsequent time. Specifically checking for activation of the identified legitimate combination-producing independent keys may entail scanning only a single column adjacent a column containing the first activated key, for example.

In some cases the table associating keys and sequence numbers contains extra sequence numbers not associated with switches of the key matrix. These extra sequence numbers can be considered as corresponding to 'ghost keys' of the keypad, for example. Such extra sequence numbers are preferably numerically between sequence numbers associated with switches on opposite edges of the key matrix.

According to yet another aspect of the invention, a method of providing input feedback in a device having a keyboard with a matrix of independent keys having associated switches, wherein combinations of adjacent keys are associated with combination key inputs, is provided. The method includes scanning the matrix for activated keys; comparing scanned key states with key states from a prior scan of the matrix; upon detection of a change in key states, analyzing the scanned key states, including, for scanned key states indicating only one active key, registering an independent key input associated with the active key, and for scanned key states indicating multiple active keys associated with a single combination input, registering the combination key input associated with the multiple active keys.

Detection of a change in key states may comprise, or even simply consist of, detection of a change in number of keys activated, for example.

In some cases the method includes, in response to detecting no change in key states as a result of comparing scanned key states with key states from a prior scan of the matrix, repeating the step of scanning the matrix for activated keys without the analyzing of the scanned key states.

Analyzing the scanned key states may further include, for scanned key states indicating multiple active keys not associated in combination with a single combination input, registering an input associated with a stored personal identification number.

Analyzing the scanned key states may include, for scanned key states indicating two active keys, determining if the two active keys are diagonally adjacent to one another and, if the two active keys are determined to be diagonally adjacent to one another, registering a combination key input associated with the two active keys.

According to another aspect of the invention, a method of providing input feedback in a device having a keyboard with a matrix of independent keys having associated switches, wherein combinations of adjacent keys are associated with combination key inputs, includes scanning the matrix for activated keys; generating a key count corresponding to how many keys are activated; and then evaluating the key count to determine whether to analyze other key state information.

In some embodiments, evaluating the key count includes comparing the key count to the numeral 'one', and, for key counts equal to one, analyzing other key state information to determine which independent key is active.

In some cases, evaluating the key count includes comparing the key count to a stored key count from a previous scan of the matrix to determine if the key count has changed.

According to yet another aspect of the invention, a method of providing input feedback in a device having a keyboard with a matrix of independent keys having associated switches, wherein combinations of adjacent keys are associated with combination key inputs, includes scanning the matrix for activated keys. In response to detecting that a key has been activated for a predetermined period of time (of, e.g., between about 160 and 250 milliseconds), or that no keys are activated in a scan following a scan in which a key was detected as activated but for a time less than the predetermined period of time, the method includes registering an input associated with the activated key.

The method also includes, in some embodiments and following registering an input associated with the activated key, resetting a timer associated with key activation time and scanning the matrix again.

In some instances the timer comprises a counter incremented for each sequential scan in which a given key is active.

Other aspects of the invention include electronic devices configured to perform the methods of the above aspects of the invention.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
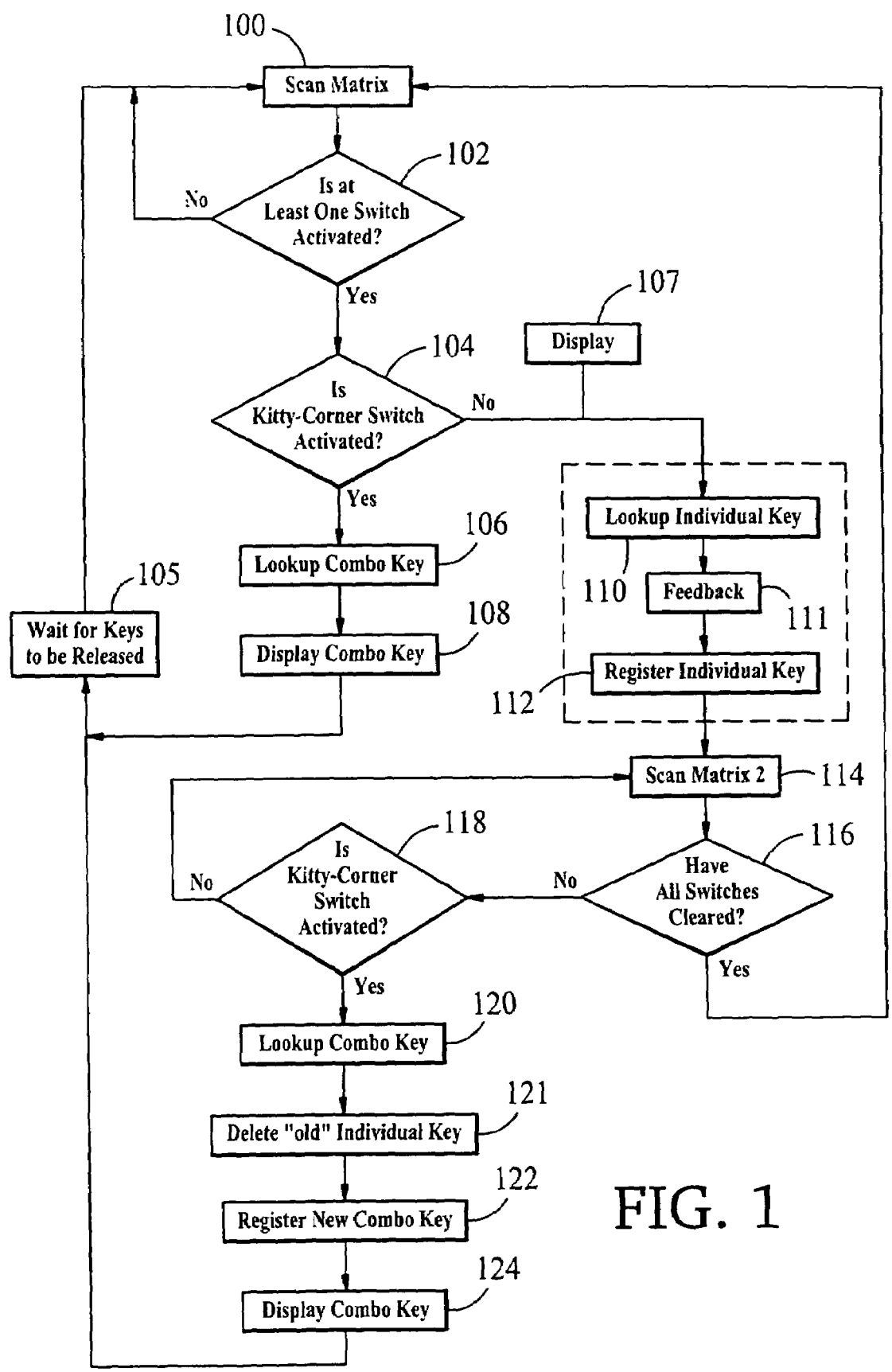
FIG. 1 shows a first algorithm for determining key actuation in a tiled keyboard with interstitial keys.
Figures 4, 5, 6:
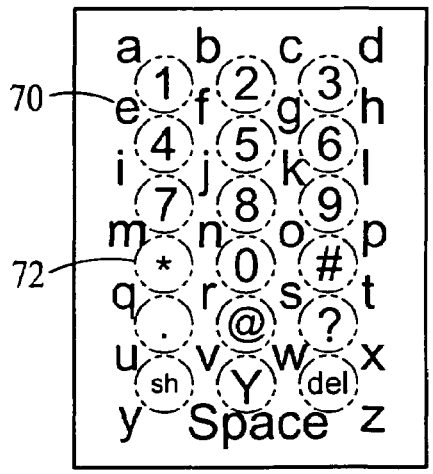
FIG. 4 shows an IACK keypad with a matrix of four independent key columns and seven independent key rows.
FIG. 5 shows a numbered representation of the switch matrix of FIG. 4.
FIG. 6 shows an alternate representation of the switch matrix of FIG. 4, employing 'ghost' rows.

FIG. 1 shows an after-the-fact (two-layer) algorithm for determining key actuation in a tiled keyboard with interstitial keys (such as the keypad shown in FIG. 4). It increases the performance as a combination of the speed of response and the accuracy of output. The algorithm provides feedback to the user within approximately 200 milliseconds of striking the keyboard, thereby providing the user the impression of an "instantaneous" response. In fact, the user's finger is still in motion at the time of feedback, and the system is still monitoring input that may occur prior to the user lifting his finger.

The algorithm is designed to provide a final output to the device display that may be different than the input registered at the time the user is provided feedback. In the embodiment shown, the system posts to be the liquid crystal display a provisional output corresponding to input received at the time feedback is provided, and then may alter this provisional output as a function of additional input received before the user lifts his finger. This algorithm may be used in conjunction with the first-stage algorithms described in FIGS. 2 and 3. (First-stage algorithms correlate with steps 100 through 114 of this figure.) The matrix scan 100 may be a traditional scan of rows and columns, or a novel approach that drives two adjacent rows simultaneously, seeking for two simultaneous output columns, thereby indicating an intended combination key output automatically. Step 102: if no keys are activated, scanning continues. Step 104: once one key activation is detected, the device determines if a kitty corner (i.e., diagonally adjacent) key is also activated. One such method is discussed below with respect to FIGS. 5 and 6. An additional scan is necessary if the two-adjacent-row approach is employed. If the active switches indicate that a combination key output is intended, step 106 looks up the desired key in an internal table and the desired combination key output is displayed in step 108. Thus, the user is provided feedback that the combination key has been registered. Feedback may be audio, visual and/or tactile. If no kitty corner switch is activated in step 104, the device provisionally interprets that an individual key output is intended and enters step 109, a phase of determining, provisionally, which individual key is intended. In step 109, the provisionally-determined output is looked up in step 110 in a table that correlates switch locations identified by the matrix scan 100 with characters such as ASCII characters and/or stored as raw data into a register and/or the display itself. The user is provided feedback that the individual key has been registered (steps 111 and 112). This feedback may also be audio, visual and/or tactile. It can be useful to delay (step 107) any or all feedback imperceptibly (approximately 20 milliseconds) to allow muscular motion to continue after the provisional output is determined. This is especially true if the user is operating keys quickly with a light touch, as may be determined by measuring the time between key strokes and correlating with any corrections as identified by use of the delete key.

This output is 'provisional' because a second layer of scanning (step 114) is next initiated to determine if the actuated switch becomes deactivated for a sufficient time to be considered open (step 116). If this occurs, the cycle returns to step 100 and starts to look for another input. If the switches have not all cleared, the device continues to scan for kitty corner switch activation in step 118. This scan continues until the switches are cleared (step 116). If a kitty corner switch is activated prior to all switches clearing, the device determines that a combination key was originally intended. The device then determines the intended combination key (step 120) and outputs the intended combination key (step 124), to the exclusion of the provisionally determined output (step 122). The user may be unaware that it is possible for the final output to be determined after he was provided feedback that the operation was registered. The number of correct hits to establish a combination output can be very small (on the order of 16 cycles at 8 MHz, or in some cases perhaps even just one cycle) to provide accurate results. This figure does not show the wait states associated with the debouncing of each individual switch as these are well-known and understood in the art.

Figure 2:
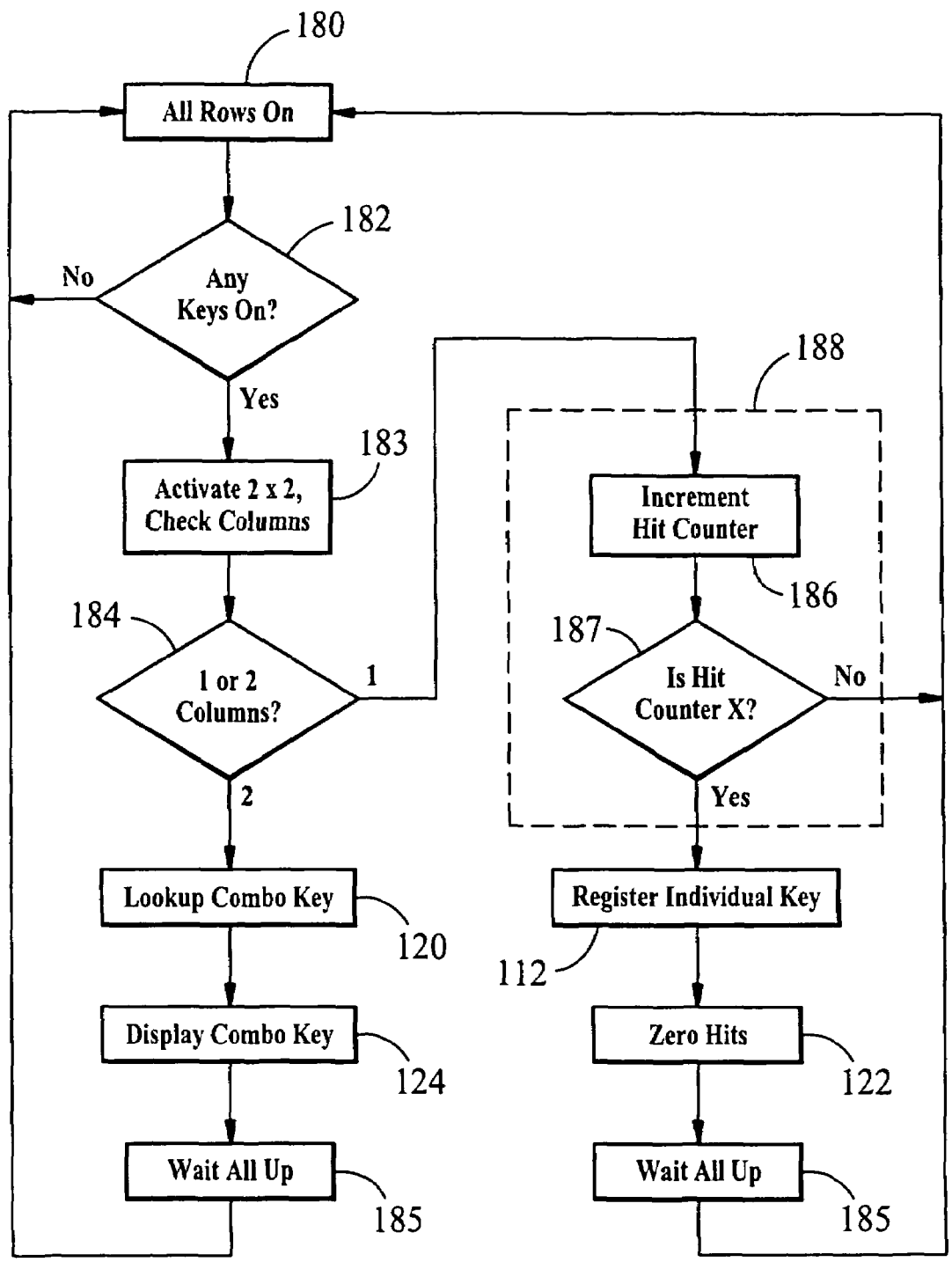
FIG. 2 shows a scanning algorithm with a device-level debounce.

FIG. 2 shows another embodiment for improved determination of key actuation in an IACK keyboard. It also accounts for the delays associated with the individual keys within a single combination key contacting at different times. In step 180 all rows are driven high simultaneously as step 182 searches on the columns for any switch activity. When at least one of the columns indicates an activated switch, the rows are driven in adjacent pairs (first and second, second and third, third and forth, etc.) as the columns are examined for switch activation in step 183. A branch occurs according to whether or not one or two columns measure a high output (step 184). If two lines are high, then the device determines which combination key is activated (step 120), displays it (step 124) and then waits until all columns are low (step 185) before repeating the process in step 180. If only one column is high, then it enters the individual key analysis of step 188. Step 188 is shown in greater detail in FIG. 3. Step 188 sets a first hit counter for keeping track of the number of cycles that the indicated key is measured as being high. Step 186 increments the counter each time. Step 187 determines if a predetermined number of counts (X) have been measured. The value of this number (Value 1) can be critical to proper operation. A preferred value is the equivalent of approximately 160–225 milliseconds, and may also be incorporated into a learn mode. For example, delete key usage after an individual key input, followed by an input of an associated combination key, may trigger an increase in this predetermined value. In step 122 the counter is reset and in step 185 the device waits until all columns are low before repeating the process in step 180.

Figure 3:
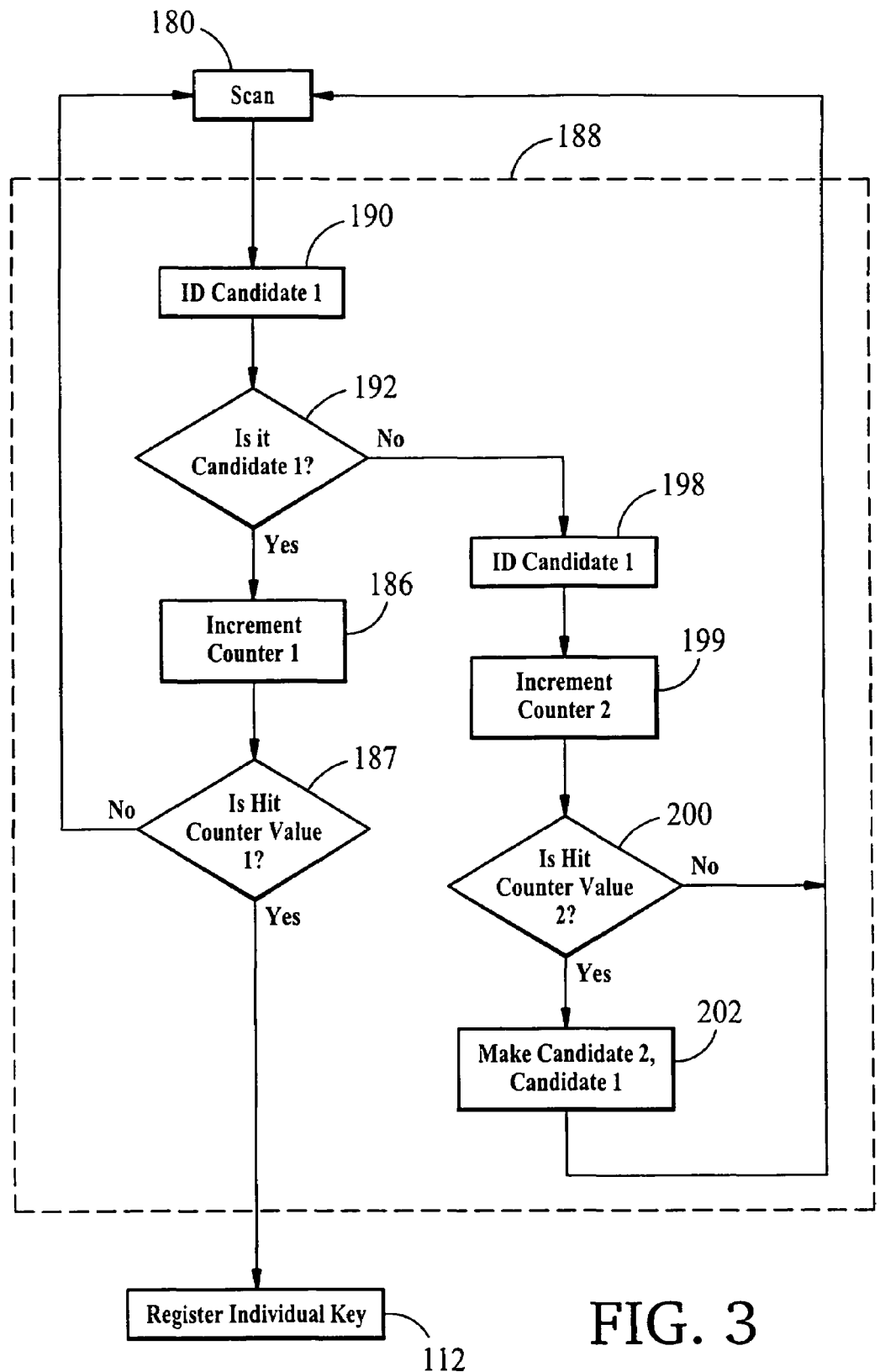
FIG. 3 shows detail of the device-level debounce algorithm.

FIG. 3 shows a detail of one embodiment of step 188. This algorithm speeds the acquisition of a final key while maintaining accuracy by providing a device-level debounce. It accounts for erratic actuations due to the extreme proximity of adjacent keys. Initially, a first candidate (Candidate 1) is identified (step 190) and the device proceeds by default through steps 192, 186 and 187. During the second cycle a branch point may occur. Step 192 is a branch point for each scan determining if the current scan matches Candidate 1 as identified in step 190. If it does, then a first counter is incremented (step 186). If this first counter, monitoring Value 1, has reached the predetermined number of counts (step 187) then the candidate is judged to be an intended output and the candidate key is output in step 112. If not, the device continues to scan (step 180) until a sufficient number of candidate measurements have been read. However, in the event that a different key stroke (i.e., witch activation) is identified in step 192, (e.g., due to device level key bouncing) then a second candidate (Candidate 2) is identified in step 198 and a second counter is incremented in step 199. If the second counter has not yet achieved a second value (Value 2), one that is significantly smaller than Value 1 (16 is a reasonable value at 8 MHz), then the cycle repeats unchanged by returning to step 180. If the total of the second counter reaches Value 2, Candidate 1 is replaced with Candidate 2 and the process returns to step 180 and begins again.

This illustrated embodiment thus includes a device-level debounce that addresses the noise associated with the operation of keys in combination in miniaturized tiled keyboards. It can briefly be described as designing the electronics and software to designate a default output based on initial readings, then reading and disregarding a predetermined number of erroneous inputs before accepting the erroneous characters as a new base, or outputting the currently accepted default output. An artificial delay is added between initial switch recognition by the keyboard and feedback to the user (on the order of 160–250 milliseconds). This delay allows the finger motion to continue unabated after a first switch recognition, thereby increasing the chance of a second intended switch contact occurring before the user retracts finger in preparation for touching a different key. The advantages of this delay are more pronounced during extremely slow or light contact by the user. It is also advantageous to implement a dynamic "learn mode" that varies the delays as a function of user input. Under the assumption that the delete key indicates errant input, the length of these delays are reassigned accordingly. For example: use of the delete key immediately following an individual output and subsequently reading an associated combination output indicates that the number of consistent measurements and/or delay time should be increased.

This two-layer scan and correction algorithm helps to maximize speed of key actuation while minimizing degradation of output reliability. It provides user feedback (visual on the display and/or tactile in the form of a "beep", for example) after determining a valid output option, and then continues to scan in preparation for modifying the original (provisional) output as a function of switch data acquired after the output has been made.

FIG. 4 shows a typical IACK keypad with a matrix of four independent key columns and seven independent key rows. Independent keys 70 are elevated above combination key regions 72. In this embodiment there are a matrix of electronic switches, each lying below and associated with a corresponding independent key 70. By pressing on an independent key 70, a user will activate the associated switch below it. By pressing a combination key region 72 and striking (minimally) two adjacent diagonal (i.e., kitty corner) independent keys 70, thereby activating the associated independent key switches, the user indicates his desire to activate a combination key 72.

FIG. 5 shows a numbered representation of the switch matrix of FIG. 4, as a table having four columns and seven rows, in the cells of which each switch is assigned a sequential numerical value. Because IACK keypads utilize adjacent diagonal switch activations around a combination key region as the minimal requirement for activation of that combination key, the system can minimize scan steps by looking for potential combinations as follows: when the system detects switch N as activated, it knows that switch N+7 lies directly to the right and hence switches N+6 and N+8 are kitty corner keys. In other words, possible combinations are keys N+R−1 and N+R+1, where R represents the number of rows in the key matrix. The identification of possible combinations may be made at the hardware scan level, allowing the device to minimize the number of scans, or may be at the software analysis level, enabling a certain level of independence between the layout geometry and the analysis algorithm. This independence can obtain significant advantage in product development when implementing a wide variety of IACK keypads, as algorithms that integrate layout to the analysis of user intent in an IACK keypad require the software to be completely rewritten for each different layout. For example, this approach enables software written to analyze input from a keypad having one number of rows to be modified to handle a keypad of a different number of rows with a simple revision of the value R in the above formulas. It will be readily apparent to those of ordinary skill how to implement an appropriate algorithm that can be applied to any keypad with keys in a given number of orthogonal rows and any number of columns.

Note that in this embodiment it is preferable to scan and analyze from one side of the switch matrix to the other side. That is to say, if a switch in column 2 is detected, the analysis of the next cycle focuses only on column 3, not column 1. Therefore a combination key region comprised of independent keys that lay in columns 1 and 2 would be first seen on the subsequent full scan of the switch matrix (i.e., with the switch in column 1 being first detected and the system then checking possible combinations with keys in column 2). While this system greatly simplifies the analysis of combination keys over most of an IACK keypad, the scheme requires special considerations when analyzing keys at the perimeter of the keypad. It will be apparent that the terms "rows" and "columns," as used herein, are interchangeable in many respects, signifying alignments or sequences of keys along different directions in the matrix.

One approach to addressing perimeter key analysis is shown in FIG. 6, in which 'ghost' rows are added above and below the rows corresponding to the physical rows of independent keys of the keypad. Also added is a ghost column 5, three "mixed" rows and a final ghost row at the bottom of the matrix. The ghost rows to do not represent physical switches, but the ghost 'switches' are assigned numerical values in the series, resulting in the numbering scheme shown. 'Ghost' indices allow the device to transparently check potential combination activations associated with switch "N" without regard for whether a key is on the border or the interior of the switch matrix, by (minimally) checking switches N+12 and N+14. For example, if switch number 4 were detected, a potential combination key may be determined merely by looking at switch numbers 16 and 18. At the perimeter the algorithm still works. For example, if switch number 14 (e.g., "b" of FIG. 4) were detected, potential combinations would be (minimally) with switch numbers 26 and 28. Of course, in this example switch number 26 is not a physical switch and will be inactive by definition. This approach allows the system to scan for only potential combinations OR to check complete scanned data sets (i.e., data streams of a scan of the entire keypad) by a simple addition instead of utilizing a complex look-up table or programming each key-case individually. Employing this approach, the complete set of keys that identify a combination may be easily defined. In this case, every valid combination in this example will consist of at least one kitty corner set of N, (N+1), (N+13) and (N+14) and no other independent keys. By this criteria there are valid combination keys that do not exist. This situation will correct itself when the system returns a "null" when it tries to look up the numeric representation of such 'ghost' combination keys. See FIG. 9 for an explanation of numeric representation of combination keys.

Mixed rows allow the system to accommodate both truly independent key functionality as well as IACK functionality from keys outside the IACK keypad grid (e.g., the grid shown in FIG. 4). In the example shown here the switches represented by numbers 48, 49 and 50 are independent keys such as "send," "clear," and "end." The keys represented by numbers 9, 10, 22 and 23 are independent keys that can also provide a combination key output. The final ghost row has been added to accommodate the addition of independent key number 50 in mixed row 3, allowing the entire keyboard to be scanned with the same efficient algorithm.

Figure 7:
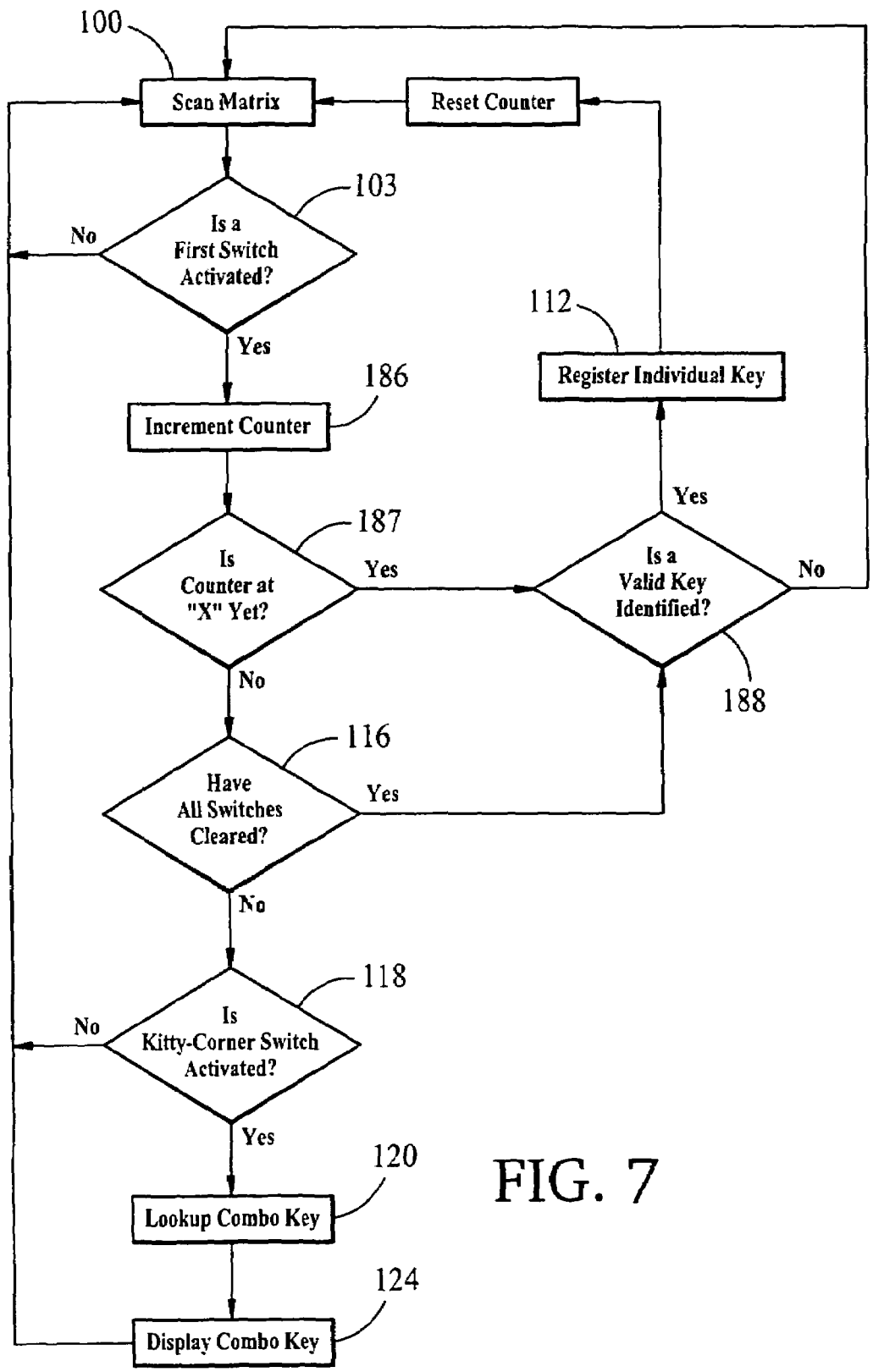
FIG. 7 shows a second scanning algorithm for an IACK keypad.

FIG. 7 shows an improved scanning algorithm for providing both fast access to individual keys and reliable reading of combination keys in an IACK keypad. Some previous IACK keypads included a timing delay in which the system pauses after the first independent key is struck, as a means to determine whether the user actually intended to activate a combination key. Also in some previous embodiments, the act of posting or "registering" an independent key to the display was a timer-based event. This embodiment features an alternate criteria as a trigger for the posting of IACK independent key output to a display, thereby providing a significant improvement to the device. In step 100 the system scans the IACK keypad to determine if a user has activated any portion of the switch matrix. In step 103 the system determines if a first switch has been activated. This is distinguished from step 102 of FIG. 1, which is looking for any active switch. Step 103 seeks to identify activity on the keyboard to initialize an output sequence. As long as a first key has been identified (activating the algorithm) and an output has not yet been provided by the system, step 103 will allow the process to flow to step 186. If not, the system continues to scan the matrix. The system increments the counter in step 186. The algorithm then has two events which will set the system onto the path of posting an independent key character to the display. The first is that the counter reaches a predetermined value (X) in step 187. (Note that the value of X preferably correlates with the time approximately equal to 160–250 milliseconds.) If the system reaches the designated delay time and a combination key has not been activated, and a valid individual key has been identified in step 188, then the system will post the identified independent key to the display in step 112. The second criteria for setting the system on the path for posting an individual key is for all the switches in the matrix to have cleared in step 116. If either: 1) the hit counter has reached its maximum value OR 2) the keys have been released after a valid key has been identified, the system will post that key to the display. This algorithm can be employed to great effect in combination with the two-level scan of FIG. 1. If neither of the conditions of steps 187 or 116 have been met, the system continues to look for combination (and/or PIN number) input by searching for a kitty corner activation in step 118. If a combination key is intended by the user, then the system looks up the appropriate combination key (or PIN) output in step 120 and displays the combination in step 124. The system then resets the counter and begins to scan the matrix again in step 100.

Figure 8:
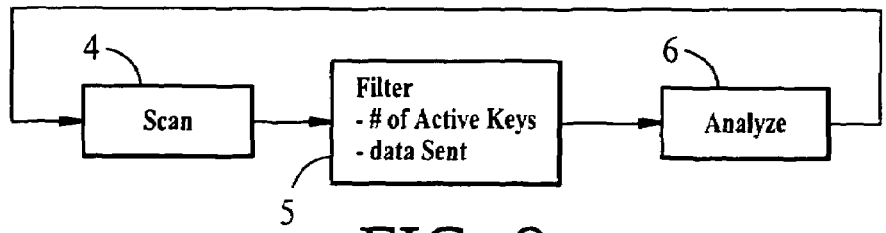
FIG. 8 shows a third algorithm for use with an IACK keypad, employing a keypad state change filter.

FIG. 8 shows an alternate embodiment for implementing the code for an IACK keypad. The system is divided primarily into three parts. The first part is scan code 4 which drives and reads the keypad matrix to collect switch data. The scan code 4 sends information about the number of keys actively being pressed and the dataset representing the state of the keyboard through filter 5 during each cycle. If the dataset meets certain criteria then the data is analyzed in step 6. Most of the time the dataset will not meet the criteria, thereby saving large amounts of processing time which can be utilized by other components within the device. In the same way, the algorithm saves power, which is very critical in portable applications.

Figure 9:
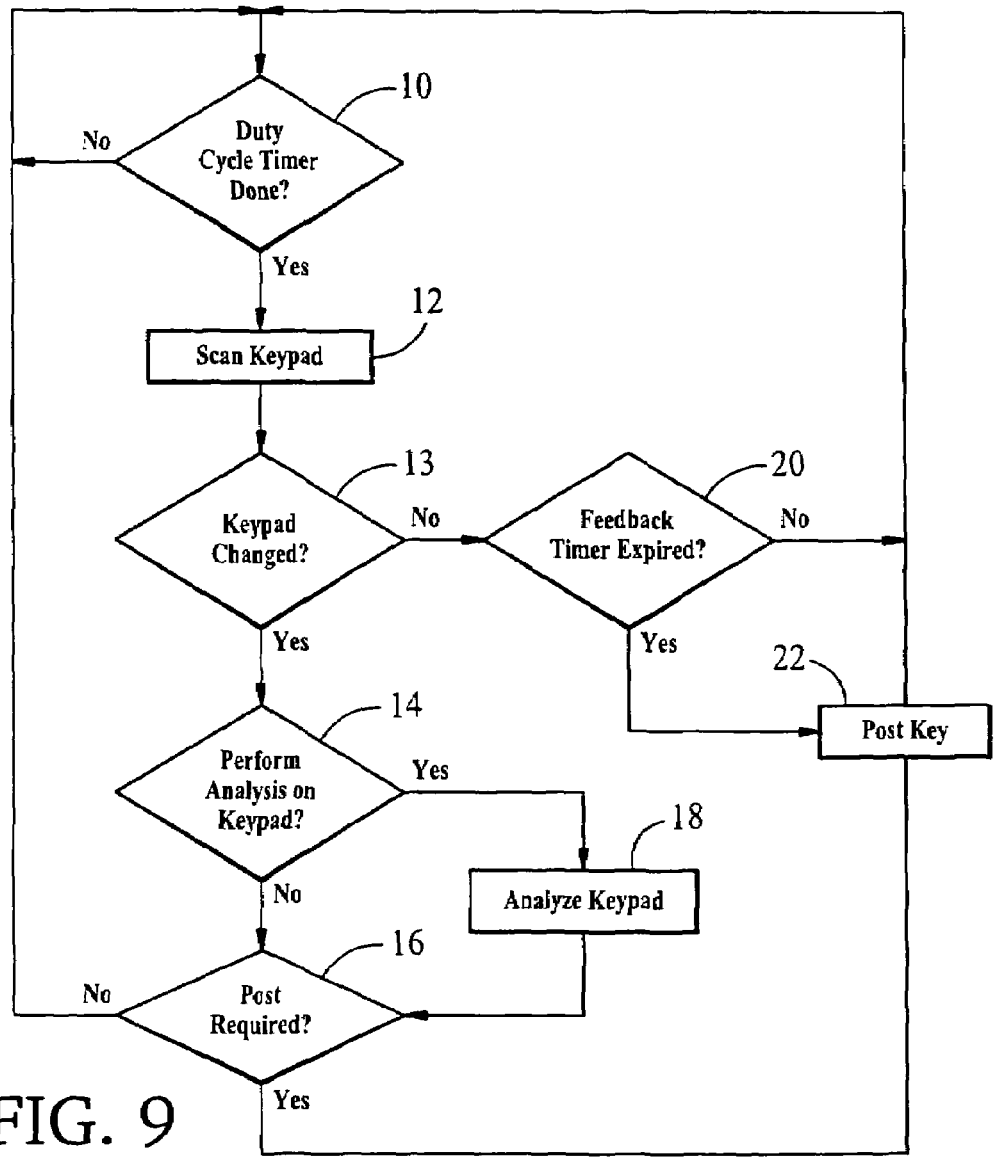
FIG. 9 illustrates a more detailed embodiment of the algorithm of FIG. 8.

FIG. 9 demonstrates how the architecture of FIG. 8 can be implemented to save power and processing time in an IACK keypad device. Analysis of the keypad matrix is broken into cycles, where each cycle results in a set of characters (usually one, but sometimes more) being posted to the LCD. Each cycle ends when all keys have been released. Within any single cycle, the keypad array is periodically scanned and the states of all keys are recorded. When the system determines that one or more states have changed from the previous scan, the scan results are analyzed in more detail and an output record is constructed with the results of the analysis. For each cycle, either a single key is depressed (corresponding to an individual key), or multiple keys are depressed (corresponding to either a Combination Key, a PIN code or an ambiguous result. If multiple keys are depressed within a single cycle, the keypad array progresses from a state where no keys are depressed to states where one, and then two, then three, etc., keys are activated. (See also FIG. 10) Each of these changes in the keypad array state can be referred to as a 'frame.' If a high enough scan rate is used, each frame will normally represent a change in the state of a single key from the previous frame. (While this is the ideal case, it is not necessary for correct system function.) For each new frame, the array is analyzed and a character may or may not be posted to the LCD. The algorithm acts as a finite state machine, selecting the next state based on the current state and the input values (keypad array and delay timer). The current state is based on what actions were taken in previous frames of the cycle. An analysis record represents the present state of the keypad array. Knowing the current state, the state of the timer, and the value of the analysis record, the system can decide what action, if any, should be taken in the current frame. Step 10 is a duty cycle timer that sets the rate at which the keyboard will be scanned. When this timer reaches a preset value, the system scans the keypad (step 12) and then passes information as to the number of keys activated (i.e., the number of switches closed) and the dataset of the switches themselves. Datasets of a keypad scan may consist of a sequence of switch activation data of the whole keypad, presented in a single word, as suggested in FIG. 7. The number of active keys is compared to the number of keys which were active on the previous scan, in step 13 (e.g., as part of the filter 5 of FIG. 8). If the number of keys has not changed, and the feedback timer has not expired (step 20), then the algorithm returns to await the next scan. If the number of keys has changed, then the system determines in step 14 if there is a need to analyze the state of the keypad in step 18. (If the number of activated keys has gone from one to zero, for example, then there is no need to perform additional analysis.) The system then performs an analysis on the keypad data set to determine user intent (step 18). An example of this analysis is detailed in FIG. 10, discussed below. The system takes the output from the analysis and in step 16 determines whether or not to post a character (or characters) to the display, such as by criteria discussed herein. The output from analysis 18 can consist of numeric representations of the character (or characters), for example, that the system has determined to be in accordance with user intent during that frame. Independent keys can be numerically represented as shown in FIG. 6, with combination keys represented by numbers corresponding to the number of its associated, upper left referent independent key plus an arbitrary constant, where the constant is larger than the largest number representing any physical or ghost key on the device. For the embodiment of FIG. 6, the number '40' would suffice as this constant. In this case, the combination key "5" would be represented by the number "51," for example. PIN codes can be identified by a string of independent key representations. In step 22 the system looks up the ASCII character(s) that correlate(s) with the numeric representation(s) and posts such character(s) or value(s) to the display and/or other locations, as needed by the device.

Figure 10:
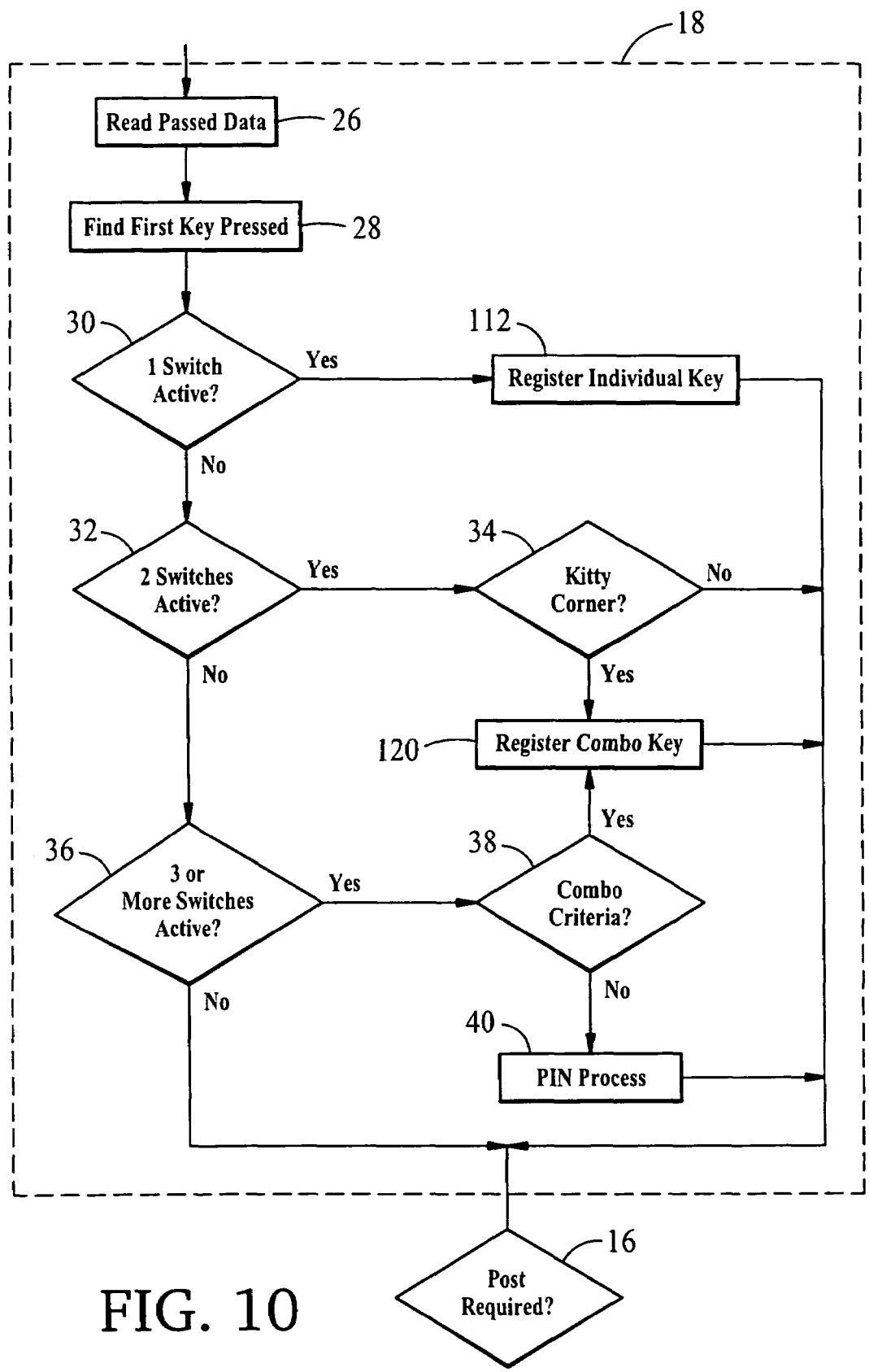
FIG. 10 shows one embodiment of the analysis step 18 of FIG. 9.

FIG. 10 shows one embodiment of the analysis performed in step 18 of FIG. 9. In step 26 the system reads the data which has been passed from the scan (e.g., scan 4 of FIG. 8) and identifies the first switch detected in this key identification sequence (step 28). This first key becomes the 'referent.' If step 30 determines that only one switch is active, then the system looks up the individual key and registers the numeric representation of that key in memory (step 112). If step 32 determines that two switches are active, then the system determines if the keys are kitty corner to each other (step 34), such as using the approach described with respect to FIGS. 5 and 6, and then looks up the appropriate combination key in step 120. If three or more switches are active in step 36, the system determines if the active keys follow the criteria for a combination key, such as that described with respect to FIGS. 5 and 6. (Note that the fourth switch of a combination key can not be identified unless the hardware has been specifically designed for that purpose.) If the combination criteria are met (and not exceeded) in step 38, the system calculates the appropriate combination key representation in step 120. If the combination criteria are exceeded, the system proceeds to step 40, where it may evaluate PIN combinations, such as described in FIG. 35 of U.S. patent application Ser. No. 09/862,948 (incorporated above by reference), and output a series of independent key numeric representations. Step 16 is shown here as the next step, as described with respect to FIG. 9.

Figure 11:
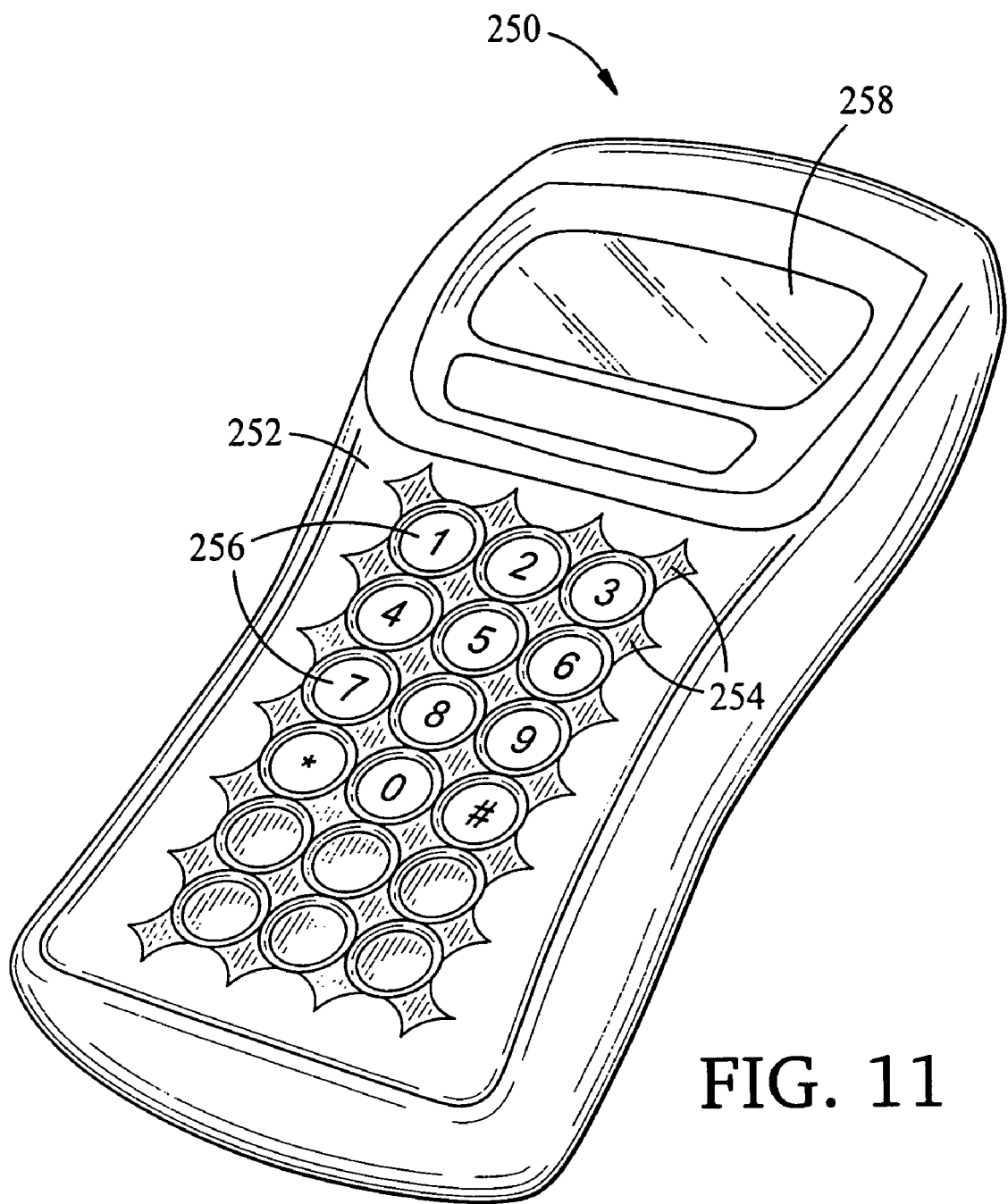
FIG. 11 shows a mobile telephone with an IACK keypad.

Referring now to FIG. 11, a mobile telephone 250 has a keypad 252 with an elastomeric keypad cover defining raised independent key regions 254 and interstitial combination key regions 256, and a display 258 for displaying alphanumeric text. Each independent key region 254 overlays an associated switch (not shown) of the switch matrix, and has an exposed surface that is elevated above the adjacent combination key regions, for fingertip activation by a user as discussed in U.S. Ser. No. 09/236,199. Telephone 250 is configured and programmed to perform all of the methods disclosed herein.

A number of embodiments of the invention have been described. Nevertheless, it will be understood that various modifications may be made without departing from the spirit and scope of the invention. Accordingly, other embodiments are within the scope of the following claims.

What is claimed is:

1. A method of providing input feedback in a device having a keyboard with a matrix of interstitial key regions and raised independent key regions, the method comprising scanning the matrix for activated key regions;

upon detection of a first activated key region, providing provisional output as visual feedback to a user indicating that the activated key region has been registered;

continuing to scan the matrix for activation of an adjacent key region prior to release of the first activated key region; and, in response to activation of the adjacent key region prior to release of the first activated key region, providing a final output to the user to the exclusion of the provisional output.

2. The method of claim 1 wherein the final output is provided as visual feedback.

3. The method of claim 2 wherein the provisional output is also provided as audio feedback.

4. The method of claim 1 wherein scanning the matrix includes scanning rows and columns.

5. The method of claim 1 wherein scanning the matrix includes driving two adjacent rows simultaneously, seeking for two simultaneous output columns.

6. The method of claim 1 wherein continuing to scan the matrix for activation of an adjacent key region includes determining if a diagonally adjacent key region is activated.

7. The method of claim 1 including looking up a desired combination key in an internal table in response to activation of an adjacent key region prior to release of the first activated key region.

8. The method of claim 1 wherein providing provisional output includes storing the provisional output as raw data into a register.

9. The method of claim 1 wherein the provisional output is provided as feedback and wherein providing the provisional output includes determining the provisional output upon detection of the first activated key region, and then delaying a predetermined amount of time after the provisional output is determined before providing feedback.

10. The method of claim 9 wherein the predetermined amount of time is approximately 20 milliseconds.

11. The method of claim 9 wherein the amount of delay time is determined from measured time between key strokes and details of correction.

12. The method of claim 1 wherein the independent key regions of the keyboard have exposed surfaces elevated above exposed surfaces of interstitial regions of the keyboard between adjacent independent key regions that together form a key combination corresponding to a stored combination key output.

13. The method of claim 1 wherein the adjacent key region is one of the independent key regions.

14. The method of claim 1 wherein the final output indicates that a combination of the first and adjacent key regions has been registered.

15. The method of claim 1 wherein both the first activated and adjacent key regions are elevated above an interstitial key region.

16. The method of claim 1 wherein only the raised independent keys key regions have associated switches.

17. The method of claim 1 wherein the first activated and adjacent key regions comprise two raised key regions on either side of an interstitial key region.

* * * * *